United States Patent [19]

Pappano et al.

[11] Patent Number: 4,639,719

[45] Date of Patent: Jan. 27, 1987

[54] APPARATUS FOR MONITORING CIRCUIT INTEGRITY

[75] Inventors: Thomas W. Pappano, Tulsa; David O. Brown, Claremore, both of Okla.

[73] Assignee: General Signal Corporation, Stamford, Conn.

[21] Appl. No.: 710,315

[22] Filed: Mar. 11, 1985

[51] Int. Cl.$^4$ ............................................. G08B 21/00
[52] U.S. Cl. .................................... 340/652; 219/497; 219/506; 340/640; 340/658; 340/655; 340/514
[58] Field of Search ............... 340/654, 649, 650, 651, 340/652, 661, 664, 663, 658, 662, 635, 509, 514, 640, 655; 219/483, 505, 497, 487, 506; 361/30, 65, 77, 79

[56] References Cited

U.S. PATENT DOCUMENTS 4,287,515 9/1981 Raber et al. .................... 340/650 X Primary Examiner—James L. Rowland
Assistant Examiner—Daniel Myer
Attorney, Agent, or Firm—Robert R. Hubbard; Milton E. Kleinman

[57] ABSTRACT

An apparatus to monitor a circuit in which an AC voltage source is connected to a plurality of paralleled current consuming loads, such as heaters, including a reactive load in parallel with the current consuming loads at a point in the circuit more distant from the voltage source than any of the current consuming loads being monitored, a phase shift detector connected to the current consuming loads and at a point in the circuit between the voltage source and the nearest current consuming load being monitored, the phase shift detector being sensitive to the shift in current phase induced by the reactor load, and an alarm connected to and actuated by the phase shift detector which provides a warning when the phase shift induced by the reactive load is lost, indicative of a failure in the circuit.

6 Claims, 1 Drawing Figure

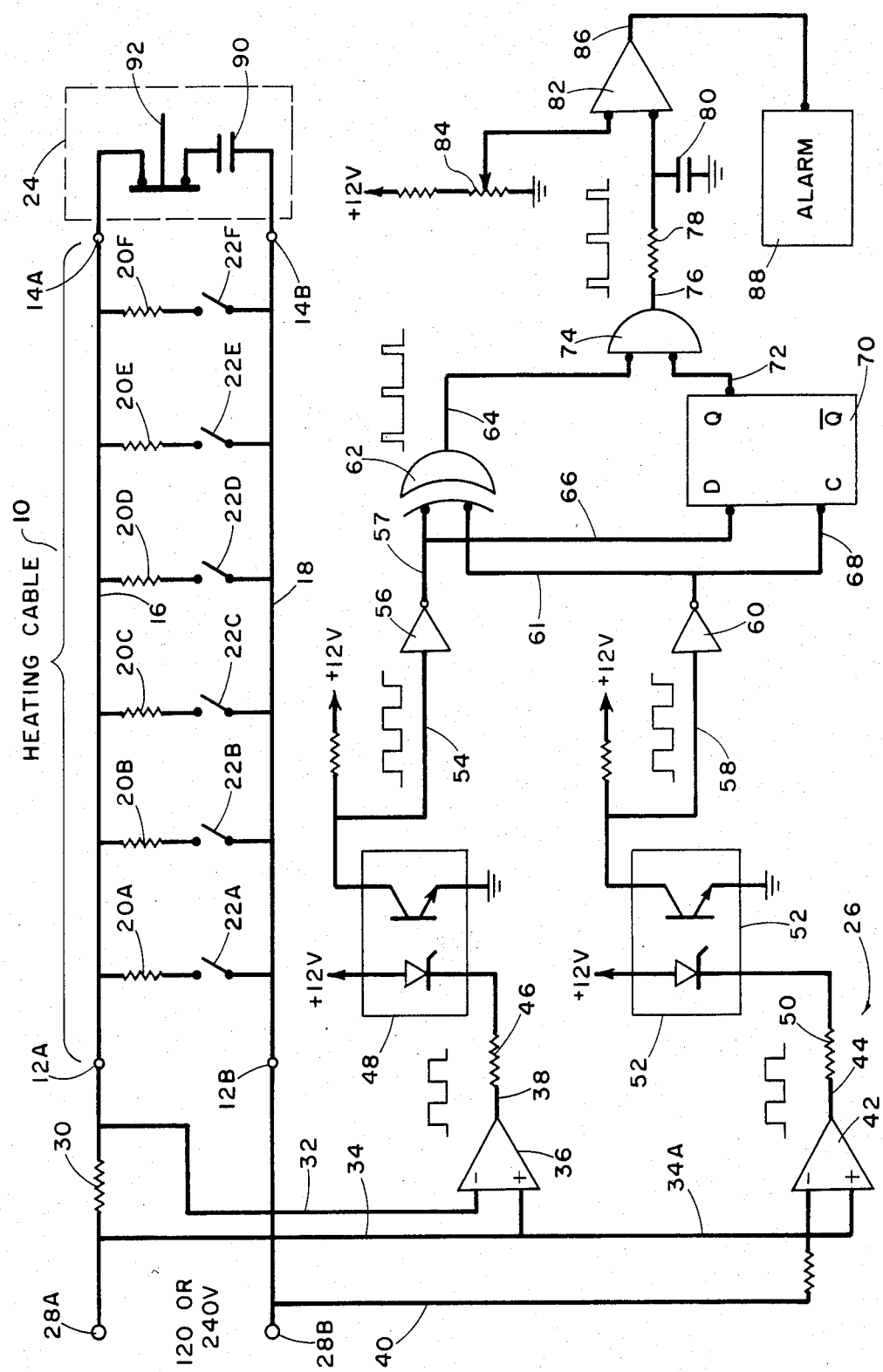

4,639,719

APPARATUS FOR MONITORING CIRCUIT INTEGRITY

SUMMARY OF THE INVENTION

In industrial applications it is frequently necessary that a voltage source be supplied by a circuit to a plurality of paralleled loads. This is exemplified particularly in the application of heater cables. Parallel heater cables of both the self-regulating and constant wattage-type have been in use for a number of years. Existing methods of testing a parallel heater cable to ascertain whether voltage is being supplied to all of the heater elements along the entire length of the cable are not completely successful. One type of monitoring system employs a signal wire built into the cable, typically referred to as a monitor wire. This system is, however, expensive.

One of the problems concerned with monitoring a parallel heater circuit is that it is difficult to utilize current or voltage measurements at the point of connection of the heater cable to obtain indication of the performance of the cable. Many parallel load heater cables in use today are self-regulating; that is, they include means for switching portions of the cable on and off in response to temperature. Thus, a measurement of current consumption is not a valid test since some, most or even all of the parallel loads may be switched off which would provide a false indication that the circuit is open. On the other hand, the quantity of current flow is an unpredictable means of monitoring the circuit since at any given time only a portion of the paralleled heater loads may be activated.

In the typical application of a heater cable employing paralleled heater loads the cable is wrapped-around a pipe or other apparatus which must be kept above a selected temperature, such as a water pump exposed to outdoor ambient temperature which must be prevented from freezing. If a portion of the cable opens somewhere along its length it means that a portion of the pipe or other apparatus to be protected by the cable will be exposed to low temperatures. The cable failure can result in the freezing of the contents of a pipe or other apparatus thereby blocking flow and causing disruption of a process plant.

For these reasons it can be seen that it is important that an operator of a heater cable have some means of knowing that the entire length of the heater cable is provided with voltage for operation of the paralleled heater loads.

The present invention provides a means of establishing the integrity of a circuit in which an AC voltage source is connected to a plurality of paralleled current consuming loads. The apparatus includes a reactive load which is connected to the circuit at a point in the circuit more distant from the voltage source than any of the current consuming loads. In the typical application of the invention to a paralleled load heater cable, the reactive load is placed at the end of the cable; that is, the end furtherest from the point where the cable connects to a voltage source. The reactive load may be either an inductive or capacitance type. The capacitance type is somewhat preferred in that a capacitor is typically less expensive than an inductor and is more reliable, that is, less subject to failure, and because in most applications of electric power, a leading current as achieved with a capacitive load advantageously compensates for the lagging current occasioned by induction devices, such as motors.

Affixed to this circuit where it attaches to a voltage source is a phase shift detector. The detector is placed in the circuit at a point in the circuit between the voltage source and the nearest current consuming load. The phase shift detector is a device which is responsive to shifts in the phase of the current waveform compared to the voltage waveform in the circuit. While many different kinds of phase shift detectors may be employed in practicing this invention a preferred arrangement includes a circuit in which a first pulse is generated representing the current flow in the circuit and a second pulse is generated representing the voltage in the circuit. These two pulses are applied to a comparator which provides an output indicative only of a difference in the phase between the two pulses. This output is applied to charge a capacitor. The voltage across the capacitor is compared to a selected DC voltage. When the phase shift occasioned by the reactive load is removed, the pulse generated representative of the current waveform and the pulse generated representative of the voltage waveform will be substantially in synchronization, resulting in a decrease in the voltage across the capacitor load thereby providing a triggering action used to initiate an alarm. The alarm may be a visual, audible or any other type of warning device.

When a number of different parallel load circuits, such as a plurality of heater cables, are employed at one location, a monitoring system may be provided utilizing a single phase detector which can be switched in sequence to monitor the current/voltage phase relationship in each of the circuits on a sequential basis. In this way, only one phase detector may be thereby employed to monitor a number of different parallel load circuits.

DESCRIPTION OF THE DRAWING

The drawing is a systematic illustration of the invention as applied to monitoring a parallel load self-regulating type heating cable.

DETAILED DESCRIPTION OF A PREFERRED EMBODIMENT OF THE INVENTION

Referring to the drawing an apparatus is schematically illustrated which discloses the application of the invention to a circuit in which an AC voltage source is connected to a plurality of parallel current consuming loads spaced at points from the voltage source. In the illustration, the plurality of current consuming loads is in the form of a heater cable as generally indicated by the numeral 10. The heater cable includes a first or input end 12A and 12B which is connected to a voltage source, and a terminal end 14A and 14B which is spaced most distance from the voltage source. The cable consists of first and second conductors 16 and 18. Connected between the conductors are resistive heater elements 20A through 20F. In some applications the heaters 20A through 20F are connected directly between conductors 16 and 18 but in others, as illustrated here, the cable is of the self-regulating type so that a switch means 22A through 22F is provided for automatically switching the heater elements 20A through 20F into and out of the circuit as required.

A problem encountered by industry is making certain at all times that the cable 10 is not defective; that is, does not have an open portion so that some of the heaters are not supplied with electrical power when heat is required. For instance, if the cable should be damaged or otherwise open in either conductor 16 or 18 between heater elements 20D and 20E, the heaters 20E and 20F would not be supplied with power. It has proven difficult to provide a warning when such occurs. The measurement of the load current of the cable is not dependable since at any given time it is usually impossible, or at least impractical, to determine which of the switches 20A through 20F are in the "on" or conductive position. The present invention provides a means of initiating an alarm if any portion of the conductors 16 and 18 in heater cable 10 open. To accomplish this result a reactive load, generally indicated by the box 24, is placed at the terminal end 14A and 14B across conductors 16 and 18 and, a phase shift detector generally indicated by the numeral 26 is connected to the current consuming loads 20A through 20F; that is, to the heating cable 10. An AC voltage source is indicated by 28A and 28B.

The phase shift detector functions to detect a shift in the phase of the current versus the phase of the voltage flowing in cable 10 as a consequence of the reactive load 24. For this purpose, the current flow through the circuit is detected by the placement of a small ohmage resistor 30 in series with conductor 16 and between the voltage source 28 and the current consuming circuit 10. The voltage drop across resistor 30 is fed by conductors 32 and 34 to a comparator 36. The output of the comparator on conductor 38 is a pulse which has the same phase relationship as the voltage drop across resistor 30 which in turn is the phase relationship of current flowing through the heating cable 10.

By means of conductors 34A and 40 voltage is fed to a second comparator 42 which provides at the output conductor 44 a pulse signal representing the phase relationship of the voltage applied to heating cable 10.

The output of comparaor 36 is fed by conductor 38 through resistor 46 to an optical coupler 48. In a like manner the output of comparator 42 is fed through a resistor 50 to a second optical comparator 52. Optical couplers 48 and 52 function to electrically isolate the balance of the phase detector circuit from line voltage.

From the optical coupler 48, by way of conductor 54, a pulse signal representing the phase of current flowing through the cable 10 is sent to a first schmidt trigger 56. In like manner the output of the second optical coupler 52 is fed by conductor 58 to a second schmidt trigger 60. Outputs from the first and second schmidt triggers, which function to further isolate the input circuit, and which provide at their outputs, pulses representing the current and voltage waveforms of the heating cable 10, are applied to an exclusive or gate 62. An output appears on conductor 64 from gate 62 only when signal is present on either conductor 57 or 61 but not on the other. The voltage output on conductor 64 from the exclusive or gate 62 is a pulse representative of the phase difference in the pulse signals input into gate 62. If no phase shift exists between the current and the voltage waveform there will be no output on conductor 64. If the phase shift is slight the width of the voltage pulse appearing on conductor 64 will be small and the width of each voltage pulse will increase as the phase shift increases.

By means of conductors 66 and 68 the outputs of schmidt triggers 56 and 60 are also fed to a D flip-flop 70, such as an RCA 4013 device. The output of the D flip-flop 70 at conductor 72 is a positive signal only if a positive signal first appears on conductor 66 followed by a positive signal on conductor 68. If the reverse is true, then no signal appears on conductor 72. Thus, the D flip-flop 70 functions as a quadrant detector for purposes which will be explained subsequently.

Signals on conductor 64 and 72 are fed to an and gate 74. The output signal at conductor 76 from the and gate is a voltage pulse representing the phase difference between the current and voltage waveforms of the heating cable circuit and such pulse on conductor 76 will appear only when the difference is occasioned by a leading current achieved by a capacitor function as the reactive load 24. The signal on conductor 76 is fed through a resistor 78 onto a capacitor 80. Resistor 78 and capacitor 80 functioning as a RC time constant circuit so that the voltage built up on capacitor 80 is directly proportional to the width of the pulses forming the voltage signal output from the and gate 74 which in turn is proportional to the phase shift between the current and the voltage waveforms at the heating cable 10. The voltage on capacitor 80 is applied to a comparator 82. A set point calibration voltage is also applied to the comparator 82 from a potentiometer 84.

The invention has been illustrated and described in which the reactive load 24 is at the end of cable 10. It is not imperative that the reactive load be at the end of the cable—it could be at an intermediate point away from the voltage source, in such case however, the alarm circuit will function only to monitor the circuit between the voltage source and the inductive load since the reactive current will not be affected by failure in the circuit beyond the reactive load.

In the preferred embodiment the reactive load 24 is attained by a capacitor 90. The concept of the invention will function with the reactive load being an inductor rather than a capacitor but the preferred arrangement employs a capacitor for the reasons that a capacitor is less expensive, more reliable and the inducement of a leading phase shift rather than a lagging phase shift is preferred in most industrial installations. With capacitor 90 in the circuit a leading current is produced which is detected by conductors 32 and 34 and applied to the comparator 36. This produces a voltage pulse fed through optical coupler 48 which is in advance of the voltage pulse fed through optical coupler 52. These pulse signals are applied to the exclusive or gate 62 and the D flip-flop 70 resulting in an output from the and gate 74. As long as capacitor 90 is in the circuit with cable 10, producing a leading waveform, a voltage is applied across capacitor 80 which is in excess of the voltage selected by the set point potentiometer 84 and alarm circuit 88 is deactivated. If a break occurs in the heating cable any place after the input 12A and 12B the leading current factor achieved by the effect of capacitor 90 is lost. This is so irrespective of the number of heating loads 20A through 20F which are at any one time consuming current; that is, irrespective of whether switches 22A through 22F are opened or closed or any combination of them are opened or closed. Further, voltage is maintained on capacitor 80 only if the current phase is leading. This is due to the quadrature detection attained by the D flip-flop 70 and and gate 74. If the leading current is lost, the voltage on capacitor 80 is diminished; then when it falls below the set point voltage from potentiometer 84 comparator 82 is turned on providing a high voltage on conductor 86 which actuates the alarm circuit 88.

The quadrature detection concept as achieved by the D flip-flop 70 and and gate 74 is important. In some instances, if capacitor 90 is lost such as by failure of conductor 16 or 18, and if the heating cable induces inductive reactance in the circuit, such as may occur if the heating cable is wound around a pipe, or if the heaters themselves cause a lagging current, an output pulse would be obtained on conductor 64 and if fed directly to the capacitor 80 would continue to maintain a voltage across the capacitor. However, to insure that the pulse output applied to capacitor 80 is representative of a leading current the combination of the D flip-flop 70 and and gate 74 will result in such voltage pulse input onto the capacitor only when the waveform is leading.

The phase detector portion of the circuit achieved by the elements 32 to 86 could be attained in other ways as there are a number of different designs for phase detection circuits. However, the preferred embodiment illustrated has advantages of simplicity, economy and dependability. The isolation of the circuit which feeds the alarm achieved by the optical couplers 48 and 52 reduces the possibility of failure of the device or the transmittal of high voltage to other parts of the circuit. By means of a push button or other type of switch 92 in series with capacitor 90 the efficacy of the alarm system can easily be verified. Further, by opening switch 92 the set point on potentiometer 84 necessary to cause the alarm 88 to function in the absence of the effect of capacitor 90 can easily be regulated.

While the invention has been described with a certain degree of particularity it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. Apparatus for monitoring circuit integrity in which an AC voltage source is connected to a plurality of paralleled current consuming loads spaced at points from a voltage source, comprising:

a reactive load in parallel with said current consuming loads at a point in the circuit more distant from the voltage source than any of the current consuming loads being monitored;

a phase shift detector connected to the current consuming loads at a point in the circuit between the voltage source and the nearest current consuming load being monitored, the phase shift detector being sensitive to the shift in current phase induced by said reactive load; and a signal means connected to and actuated by said phase shift detector, the signal means providing a warning when the phase shift induced by said reactive load is lost.

2. The apparatus according to claim 1 wherein said reactive load is a capacitive load.

3. The apparatus according to claim 1 wherein said phase shift detector comprises:

means for generating a voltage pulse representative of the current flow through said circuit;

means for generating a voltage pulse representative of the voltage applied to said circuit; and means for comparing said current and voltage pulses pulses to produce a signal representative of the phase difference between the said pulses.

4. The apparatus according to claim 3 wherein said means for comparing said current and voltage pulses comprises a comparator circuit producing an output voltage pulse representative of the phase difference between said current and voltage pulses and including a capacitor charged by the output voltage pulse, and including a comparator circuit by which the voltage across said capacitor is compared to a selected set point voltage.

5. The apparatus according to claim 1 including:

means to vary the reactance of said reactive load providing a test means.

6. The apparatus according to claim 5 wherein said means to vary the reactance of said reactive load includes switch means in series with said reactive load.

* * * * *